United States Patent [19]
Knierim

[11] Patent Number: 5,517,534
[45] Date of Patent: May 14, 1996

[54] PHASE LOCKED LOOP WITH REDUCED PHASE NOISE

[75] Inventor: David L. Knierim, Wilsonville, Oreg.

[73] Assignee: Tektronix, Inc., Wilsonville, Oreg.

[21] Appl. No.: 338,978

[22] Filed: Nov. 14, 1994

Related U.S. Application Data

[63] Continuation of Ser. No. 895,060, Jun. 8, 1992, abandoned.

[51] Int. Cl.$^6$ ........................................................... H04L 7/00
[52] U.S. Cl. ........................ 375/371; 375/376; 327/336; 331/16; 331/17; 331/25; 455/260
[58] Field of Search ............................. 375/371–376, 375/346, 350, 351; 331/18, 14, 16, 17, 25, 34; 341/77, 143; 364/733; 327/336; 455/260

[56] References Cited

U.S. PATENT DOCUMENTS

| | | | |
|---|---|---|---|
| 4,204,174 | 5/1980 | King | 331/16 |
| 4,593,271 | 6/1986 | Candy | 340/347 |
| 4,609,881 | 9/1986 | Wells | 331/1 A |
| 4,816,774 | 3/1989 | Martin | 331/1 A |
| 4,951,004 | 8/1990 | Sheffer et al. | 331/25 |
| 4,965,531 | 10/1990 | Riley | 331/16 |
| 5,038,117 | 8/1991 | Miller | 331/16 |
| 5,055,802 | 10/1991 | Hietala et al. | 331/16 |
| 5,056,054 | 10/1991 | Wong et al. | 375/120 |
| 5,166,642 | 11/1992 | Hietala | 375/120 |

OTHER PUBLICATIONS

Microwaves & RF—"Fast Synthesizers"—p. 122—Sep. 1991.
Hewlett–Packard Journal Feb. 1989—"A Generating a Phase-Locked Binary Reference Frequency"—p. 68.
Analog Devices, Inc.—Mixed–Signal Design Seminar, VI–4 through VI–7 Copyright @ 1991, ISBN–0–916550–08–7.

*Primary Examiner*—Stephen Chin
*Assistant Examiner*—Amanda T. Le
*Attorney, Agent, or Firm*—Francis I. Gray

[57] ABSTRACT

An accumulator-based phase locked loop reduces phase noise by shifting the energy of the phase noise to higher frequencies. A second accumulator is inserted between a first accumulator and a pulse generator to integrate a phase error from the first accumulator referenced to a clock signal. The output of the pulse generator is an approximation frequency signal that is compared with a comparable frequency signal derived from a reference signal to produce an error signal to control the frequency of the clock signal.

3 Claims, 3 Drawing Sheets

PHASE LOCKED LOOP WITH REDUCED PHASE NOISE

This is a continuation of application Ser. No. 07/895,060 filed Jun. 8, 1992 and now abandoned.

BACKGROUND OF THE INVENTION

The present invention relates to locking one frequency signal to another frequency signal, and more particularly to a phase locked loop with reduced phase noise that shifts the energy of the phase noise to higher frequencies.

The conventional way to lock a f*N voltage controlled oscillator (VCO) to an f*M frequency reference, where N and M are integers and f is a common frequency component, is to divide the two frequency signals by the integers N and M respectively and phase lock the resulting f frequency outputs together. If N and M are large, however, this approach may not provide sufficient loop bandwidth to overcome phase noise in the VCO. The loop bandwidth should not be much over f/10.

One prior art way of addressing this loop bandwidth problem is to synthesize an approximation of f*M/P using hardware running on the f*N frequency clock. Here P is a small integer such that M/P<N. For example if f=1 Hz, N=1000, M=1007 and P=4, a 1007/4 (f*M/P)=251.75 Hz approximation is synthesized from the 1000 Hz (f*N) source as follows. On every 1000 Hz clock an accumulator is incremented by 1007. If the result is positive, the accumulator is decremented by P*N=4000 and an output pulse is generated. The 1007 Hz (f*M) clock is divided by 4 and used to lock the 251.75 Hz approximation just generated. With a slow enough loop filter, this gives the desired results. However the phase noise of the 251.75 Hz approximation has significant low frequency energy requiring the slow loop response.

Another prior art way for addressing this loop bandwidth problem is to synthesize a sine wave of frequency f*M/P using hardware running on the f*N frequency clock. In this case P is such that M/P<N/2. The sine wave is synthesized using a read only memory (ROM) look-up table on the upper (or all) bits of a first (only) accumulator, followed by a digital to analog converter and a narrow band pass filter at the frequency f*M/P. The sine wave is squared up and used in a phase comparator as in the above prior art method. This method allows a fast loop response, but requires more analog parts and the phase alignment is very sensitive to the accuracy of the band pass filter components.

What is desired is a phase locked loop with reduced phase noise that allows a fast loop response.

SUMMARY OF THE INVENTION

Accordingly the present invention provides a phase locked loop with reduced phase noise by shifting the energy of the phase noise to a higher frequency. An accumulator-based phase locked loop generates an approximation frequency from a clock signal generated by a voltage controlled oscillator (VCO). The approximation frequency is phase compared with a comparable frequency derived from a reference signal to generate an error control signal. The error control signal is used to control the frequency of the clock signal. A second accumulator circuit is inserted between the first accumulator circuit of the phase locked loop and a pulse generator from which the approximation frequency is obtained to integrate the phase error from the first accumulator circuit. The integration serves to shape the phase noise so that the energy is moved to higher frequencies.

The objects, advantages and other novel features of the present invention are apparent from the following detailed description when read in light of the appended claims and attached drawing.

DESCRIPTION OF THE PREFERRED EMBODIMENT

Figure 1:
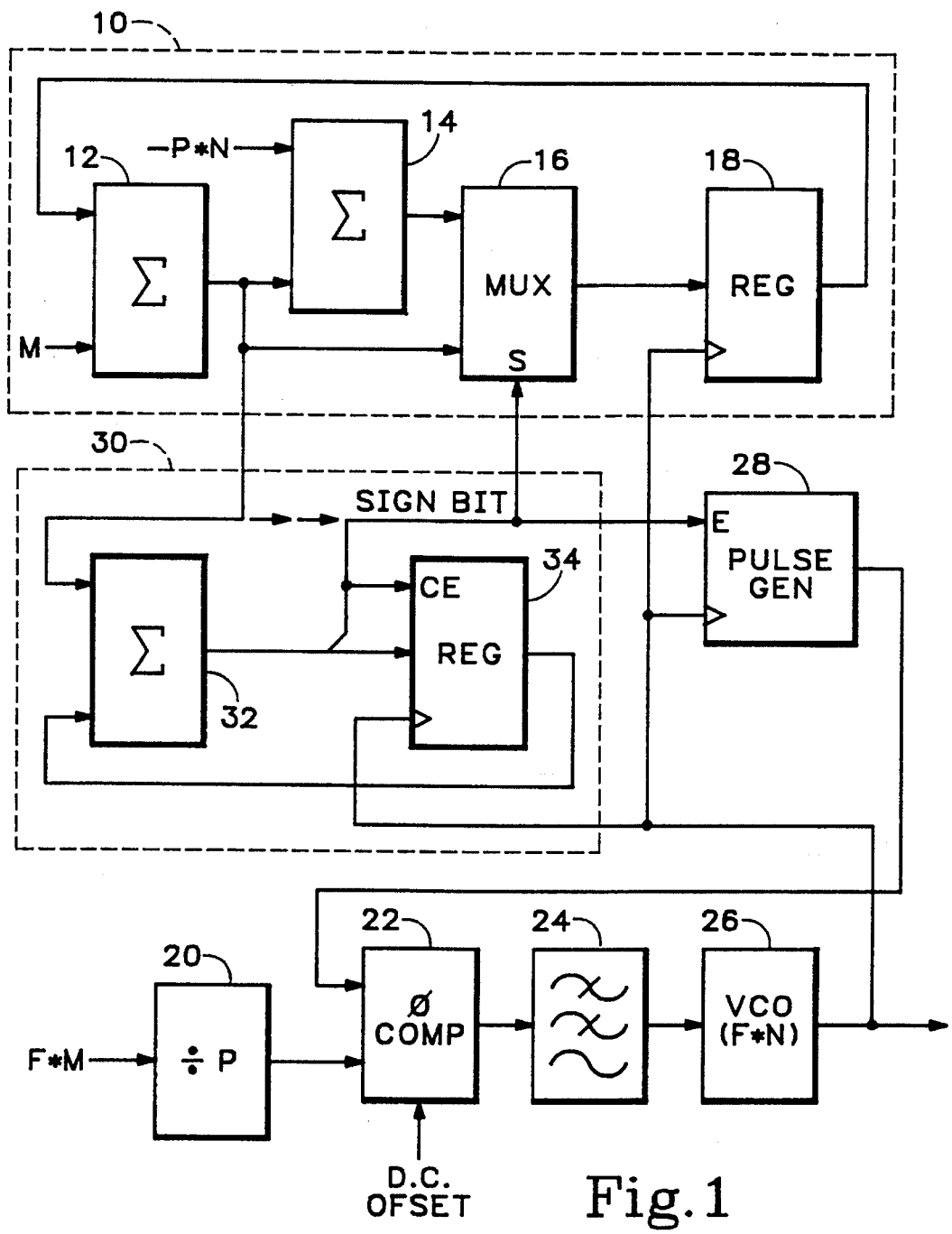
FIG. 1 is a block diagram of a first embodiment for a phase locked loop according to the present invention.

Referring now to FIG. 1 a first accumulator 10 includes a first summing circuit 12 with a fixed integer M as one input. The output of the first summing circuit 12 forms one input to a second summing circuit 14, the other input to the second summing circuit being an integer −P*N. The outputs of the first and second summing circuits 12, 14 are input to a multiplexer 16. The output of the multiplexer 16 is clocked into a first register 18, with the output of the register being the other input to the first summing circuit 12.

A reference frequency signal f*M is input to a divider 20 having an integer divisor of P. The output of the divider 20 provides one input to a phase comparator 22. The output of the phase comparator 22 is input to a lowpass loop filter 24, the output of which provides a control voltage for a voltage controlled oscillator (VCO) 26 having an output signal at frequency f*N. The output of the VCO 26 is used to clock the first register 18, and to clock a pulse generator 28 when the pulse generator is enabled. The output of the pulse generator 28 provides the second input to the phase comparator 22. If the sign bit from the output of the first summing circuit 12 is used as the select signal for the multiplexer 16 and the enable signal for the pulse generator 28, then the circuit behaves as the prior art accumulator-based phase locked loop circuit described above.

However the present invention adds a second accumulator circuit 30 having a third summing circuit 32 to which the output of the first summing circuit 12 is input. The output of the third summing circuit 32 is clocked into a second register 34 that is clock enabled by the sign bit of such output and clocked by the output of the VCO 26. This sign bit from the third summing circuit 32 output provides the select signal for the multiplexer 16 and the enable signal for the pulse generator 28. The output of the second register 34 provides the second input to the third summing circuit 32.

Typical phase comparators 22 have a non-linear region near zero in their voltage to delta-phase transfer characteristics. For best results it is desirable to operate in the linear region of the transfer characteristic, so long as the linear region is greater than twice the clock period of the VCO 26. Therefore a d.c. offset may be added to the phase comparator to move the center of the operating region from zero to the middle of one of the linear regions above or below zero. Although this d.c. offset shows up as a phase offset, this is readily compensated for digitally, as is well known to those of ordinary skill in the art.

In operation the present invention shapes the phase noise of the f*M/P approximation from the pulse generator 28 to have more high frequency and less low frequency energy. This allows a higher frequency loop filter 24 to still reject a sufficient amount of phase noise. The second accumulator 30 accumulates the output of the first accumulator 10. The second accumulator 30 is clocked only when the output of the third summing circuit 32 is positive. The decrement by P*N of the first accumulator 10 and the output pulse generation from the pulse generator 28 are both determined by the clocking of the second accumulator 30 rather than the sign of the first accumulator 10. The second accumulator 30 serves to integrate the phase error before it is quantized. Since the quantization introduces white shaped noise on the integral of the phase error, the phase noise is blue shaped, i.e., the phase noise is proportional to frequency, analogous to the noise shaping performed in high speed Sigma Delta analog to digital converters (ADCs). The analog integrator in the phase locked loop, together with the frequency in to phase out integration inherent in a VCO, form a two pole filter that effectively filters out the blue shaped phase error. It should be noted that the output of the accumulator 10 may be taken from either summing circuit 12 or register 18 within the accumulator.

Figure 2:
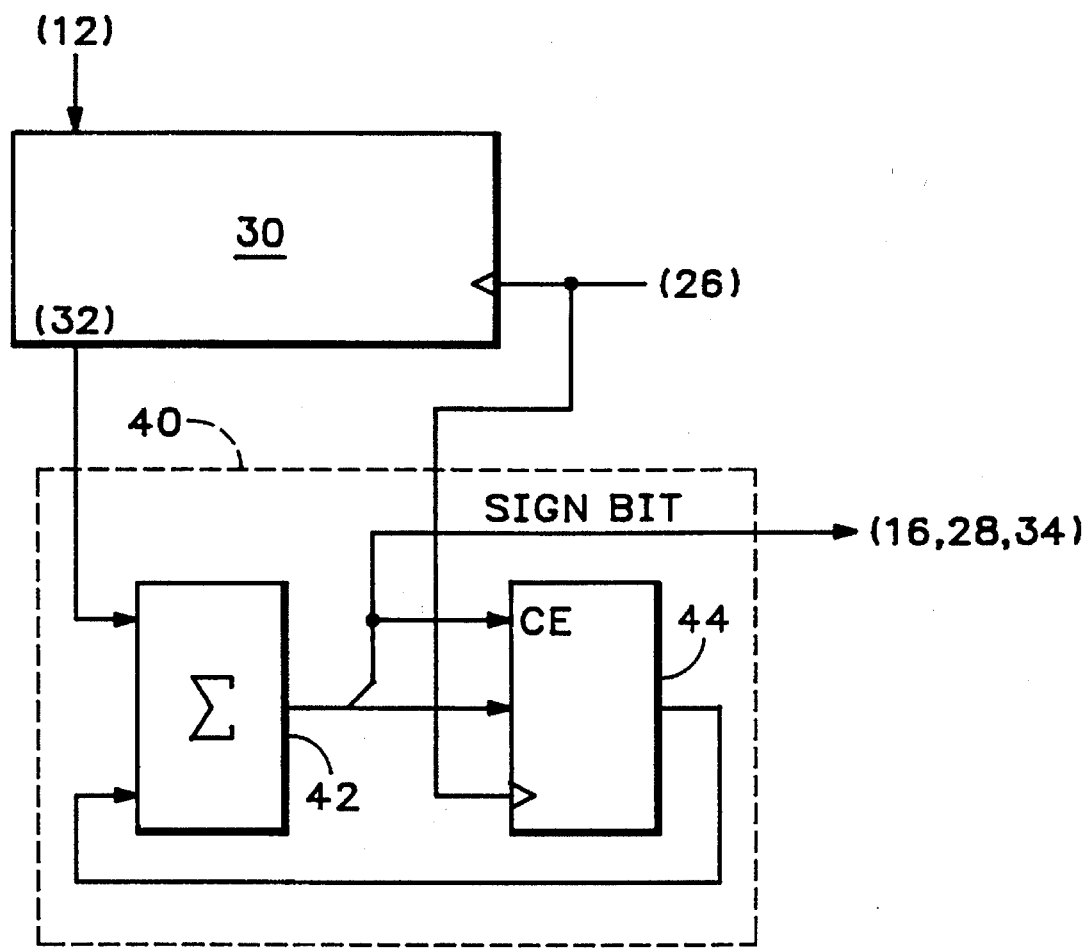
FIG. 2 is a partial block diagram of a second embodiment for the phase locked loop according to the present invention.

It is possible to use a second order filter in place of the single integrator shown in FIG. 1 to do the noise shaping. This is accomplished as shown in FIG. 2 by adding a third accumulator 40 having a fourth summing circuit 42 and a third register 44 to the circuitry of FIG. 1. The output of summing circuit 32 within the second accumulator 30 is one input to the fourth summing circuit 42 and the output of the third register 44 is the other input. The output of the fourth summing circuit 42 is clocked into the third register 44 by the clock from the VCO 26 when the third register is clock enabled by the sign bit of such output. The sign bit also serves as the switch control for the multiplexer 16, the enable signal for the pulse generator 28 and the clock enable signal for register 34. The operation is the same as for the circuitry of FIG. 1 except that a second integration operation is performed on the phase noise. This results in some more of the phase noise energy being shifted to the higher frequencies. However the linear region of phase comparator 22 must be four times the period of the clock from the VCO 26.

Figure 3:
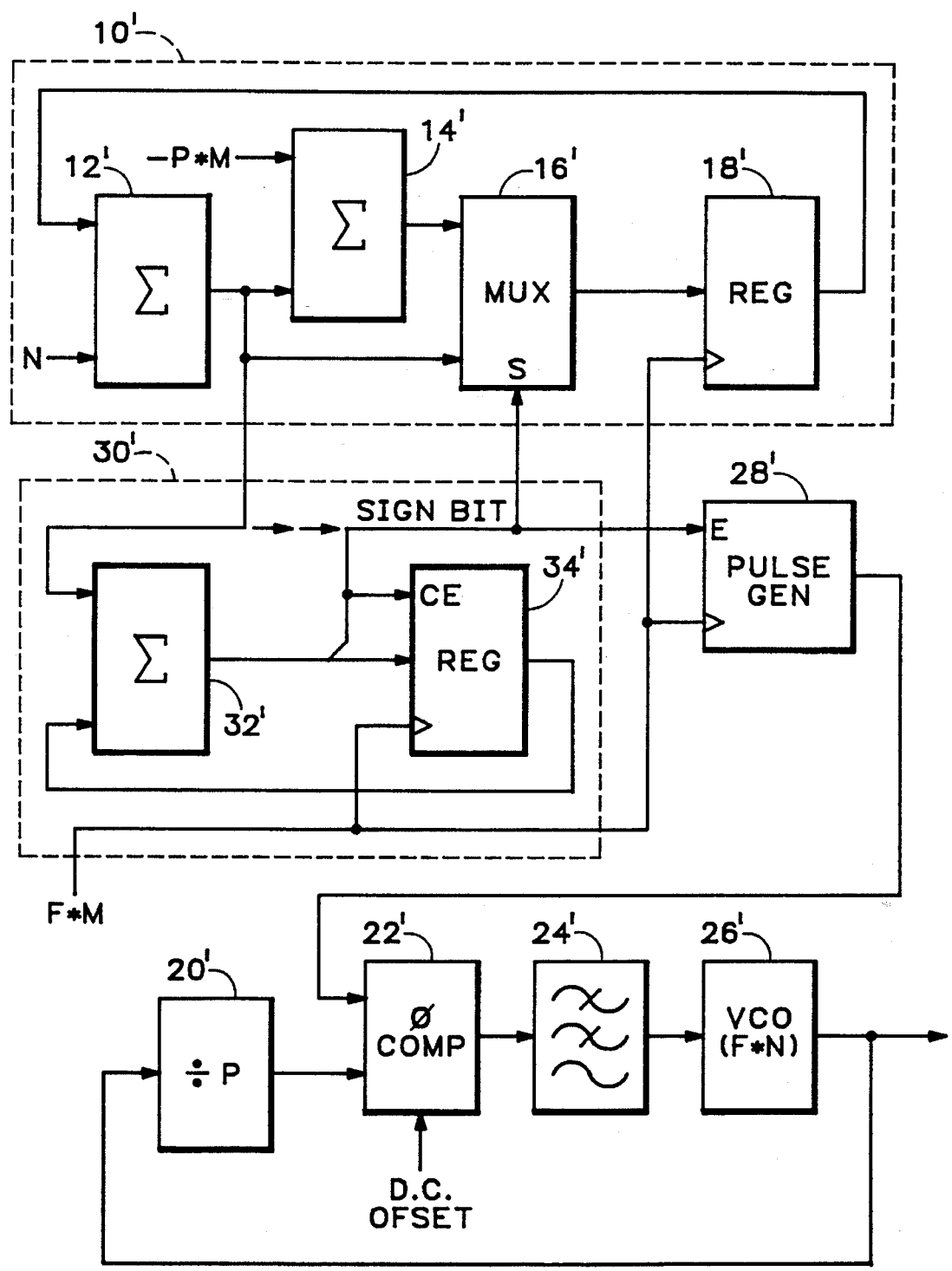
FIG. 3 is a block diagram of a third embodiment for the phase locked loop according to the present invention.

An alternative embodiment to that shown in FIG. 1 is shown in FIG. 3. In this embodiment, using the values disclosed in the Background of the Invention above, a 250 Hz approximation is generated from the f*M reference signal for phase comparison with the output of the VCO 26'. The basic elements are the same as those in FIG. 1, with the identifying numerals primed. The differences are that the inputs to the first accumulator 10' are N at summing circuit 12' and −P*M at summing circuit 14'. Further the clock signal for the two accumulators 10', 30' and the pulse generator 28' is the reference signal f*M, while the output of the VCO 26' is input to the divider 20'. The operation of this circuit is the same as that of FIG. 1, only the approximation frequency that is compared by the phase comparator 22' is different.

Thus the present invention provides a phase locked loop with reduced phase noise by shifting the phase noise energy to a higher frequency through integration using additional accumulator circuits in an accumulator-based phase locked loop.

What is claimed is:

1. A phase locked loop for locking an output frequency to a reference frequency of the type having means for generating an approximation frequency signal from a clock signal and an output of an accumulator and having means for comparing the phase of the approximation frequency signal with a frequency signal that has a frequency comparable to that of the approximation frequency signal, the frequency signal being derived from the reference frequency where the clock signal is the output frequency or from the output frequency where the clock signal is the reference frequency, to obtain an error signal for controlling a voltage controlled oscillator which produces the output frequency, wherein the accumulator comprises:

a first accumulator having as inputs the clock signal and a control signal and having an output; and a second accumulator having as inputs the output from the first accumulator and the clock signal and having an output including a sign bit, the sign bit being the control signal for the first accumulator and being the output from the accumulator for the generating means, so that the output from the first accumulator is integrated prior to the generating means to shape phase noise by shifting the energy of the phase noise to higher frequencies.

2. The phase locked loop of claim 1 wherein the second accumulator comprises:

a summing circuit having the output of the first accumulator as one input and having an output including the sign bit; and a register having the output of the summing circuit as input and having an output that provides another input to the summing circuit, the register being clocked by the clock signal when enabled by the sign bit.

3. The phase locked loop of claim 1 wherein the accumulator further comprises a third accumulator having as inputs the output from the second accumulator and the clock signal and having an output signal including a sign bit, where the third accumulator sign bit is the control signal for the first accumulator and is the output from the accumulator for the generating means.

* * * * *